United States Patent
Lee et al.

(10) Patent No.: US 12,468,080 B2
(45) Date of Patent: Nov. 11, 2025

(54) POLARIZATION FILM AND DISPLAY APPARATUS INCLUDING THE SAME

(71) Applicant: SAMSUNG DISPLAY CO., LTD., Yongin-si (KR)

(72) Inventors: Dukjin Lee, Yongin-si (KR); Beonghun Beon, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 396 days.

(21) Appl. No.: 18/134,427

(22) Filed: Apr. 13, 2023

(65) Prior Publication Data

US 2024/0027668 A1 Jan. 25, 2024

(30) Foreign Application Priority Data

Jul. 20, 2022 (KR) .................. 10-2022-0089684

(51) Int. Cl.
*G02B 5/30* (2006.01)
*H10K 59/80* (2023.01)

(52) U.S. Cl.
CPC .......... *G02B 5/3083* (2013.01); *G02B 5/3016* (2013.01); *H10K 59/873* (2023.02); *H10K 59/8793* (2023.02)

(58) Field of Classification Search
CPC .......... H10K 59/8793; G02B 5/3083
See application file for complete search history.

(56) References Cited

U.S. PATENT DOCUMENTS

| 2018/0321553 A1* | 11/2018 | Robinson | G02F 1/133634 |
| 2023/0371347 A1* | 11/2023 | Beon | H10K 59/8791 |

FOREIGN PATENT DOCUMENTS

| CN | 110235029 A * | 9/2019 | ....... G02F 1/133536 |
| KR | 100877926 B1 | 1/2009 | |
| KR | 20110066255 A * | 6/2011 | ......... G02F 1/13363 |
| KR | 102084118 B1 | 10/2017 | |
| KR | 102126056 B1 | 6/2020 | |
| KR | 20210147422 A | 12/2021 | |
| WO | WO-2006001448 A1 * | 1/2006 | ............... G02B 5/30 |

* cited by examiner

*Primary Examiner* — Mariceli Santiago
(74) *Attorney, Agent, or Firm* — CANTOR COLBURN LLP

(57) ABSTRACT

A polarization film includes: a polarization layer; a first light compensation film arranged on one side of the polarization layer and including a positive A plate; and a second light compensation film arranged on one side of the first light compensation film and including a positive C plate. A value of $n_e(+C)-n_e(+A)$ is positive at a wavelength of 450 nm and negative at a wavelength of 650 nm. Here, $n_e(+A)$ denotes an extraordinary refractive index of the first light compensation film and $n_e(+C)$ denotes an extraordinary refractive index of the second light compensation film.

20 Claims, 11 Drawing Sheets

POLARIZATION FILM AND DISPLAY APPARATUS INCLUDING THE SAME

This application claims priority to Korean Patent Application No. 10-2022-0089684, filed on Jul. 20, 2022, and all the benefits accruing therefrom under 35 U.S.C. § 119, the content of which in its entirety is herein incorporated by reference.

BACKGROUND

1. Field

One or more embodiments relate to a polarization film and a display apparatus including the same.

2. Description of the Related Art

A display apparatus is an apparatus implementing images and includes a liquid crystal display ("LCD") apparatus, an organic light emitting display ("OLED") apparatus, an electrophoretic display ("EPD") apparatus, and the like. In such display apparatus, a polarization film is used to prevent light introduced from outside from being reflected from the front of the display apparatus.

SUMMARY

One or more embodiments include a polarization film having excellent anti-reflection characteristics and reflection chroma (or saturation) characteristics and a display apparatus including the polarization film. However, these problems are merely examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a polarization film includes: a polarization layer; a first light compensation film arranged on one side of the polarization layer and including a positive A plate; and a second light compensation film arranged on one side of the first light compensation film and including a positive C plate, where a value of $n_e(+C)-n_e(+A)$ is positive at a wavelength of 450 nanometers (nm) and negative at a wavelength of 650 nm. Here, $n_e(+A)$ denotes an extraordinary refractive index of the first light compensation film and $n_e(+C)$ denotes an extraordinary refractive index of the second light compensation film.

In an embodiment, the value of $n_e(+C)-n_e(+A)$ may be about 0.02 to about 0.08 at a wavelength of 450 nm and about −0.08 to about −0.02 at a wavelength of 650 nm.

In an embodiment, an azimuthal angle color distribution ("AACD") value at a polar angle of 60° of the polarization film may be 10 or less. Here, the AACD={Max(a*)−Min(a*)}×{Max(b*)−M(b*)}, where a* and b* are coordinate values in a CIE L*a*b* coordinate system, Max(a*) and Min(a*) are a maximum value and a minimum value among a* coordinate values measured for an azimuth angle φ=0° to 360°, respectively, and Max(b*) and Min(b*) are a maximum value and a minimum value of b* coordinate values measured for an azimuth angle φ=0° to 360°, respectively.

In an embodiment, the second light compensation film may include liquid crystal molecules.

In an embodiment, the liquid crystal molecules may be rod-shaped.

In an embodiment, the first light compensation film may include a quarter-wave plate ("QWP").

In an embodiment, the first light compensation film may have reverse wavelength dispersion.

In an embodiment, the wavelength dispersion (DSP) of the first light compensation film may satisfy the following conditions:

DSP(450 nm)=R(450 nm)/R(550 nm)<1,

DSP(650 nm)=R(650 nm)/R(550 nm)>1, where R(λ) denotes a phase difference value at a wavelength λ.

In an embodiment, the polarization film may further include a third light compensation film arranged on one side of the second light compensation film and including a negative C plate.

In an embodiment, the polarization film may further include a fourth light compensation film arranged on one side of the third light compensation film and including a positive C plate.

According to one or more embodiments, a display apparatus includes: a substrate; a plurality of display elements disposed over the substrate; an encapsulation member encapsulating the plurality of display elements; and a polarization film disposed over the encapsulation member, where the polarization film includes: a polarization layer; a first light compensation film arranged on one side of the polarization layer and including a positive A plate; and a second light compensation film arranged on one side of the first light compensation film and including a positive C plate where a value of $n_e(+C)-n_e(+A)$ is positive at a wavelength of 450 nm and negative at a wavelength of 650 nm. Here, $n_e(+A)$ denotes an extraordinary refractive index of the first light compensation film and $n_e(+C)$ denotes an extraordinary refractive index of the second light compensation film.

In an embodiment, the value of $n_e(+C)-n_e(+A)$ may be about 0.02 to about 0.08 at a wavelength of 450 nm and about −0.08 to about −0.02 at a wavelength of 650 nm.

In an embodiment, an azimuthal angle color distribution (AACD) value at a polar angle of 60° of the polarization film may be 10 or less. Here, the AACD={Max(a*)−Min(a*)}×{Max(b*)−M(b*)}, where a* and b* are coordinate values in a CIE L*a*b* coordinate system, Max(a*) and Min(a*) are a maximum value and a minimum value among a* coordinate values measured for an azimuth angle φ=0° to 360°, respectively, and Max(b*) and Min(b*) are a maximum value and a minimum value of b* coordinate values measured for an azimuth angle φ=0° to 360°, respectively.

In an embodiment, the encapsulation member may include a thin film encapsulation layer, and the thin film encapsulation layer may include a first inorganic encapsulation layer, an organic encapsulation layer, and a second inorganic encapsulation layer that are sequentially stacked.

In an embodiment, the second light compensation film may be arranged closer to the encapsulation member than the polarization layer.

In an embodiment, the second light compensation film may include rod-shaped liquid crystal molecules.

In an embodiment, the first light compensation film may include a quarter-wave plate (QWP).

In an embodiment, wavelength dispersion (DSP) of the first light compensation film may satisfy the following conditions:

DSP(450 nm)=R(450 nm)/R(550 nm)<1,

DSP(650 nm)=R(650 nm)/R(550 nm)>1, where R(λ) denotes a phase difference value at a wavelength λ, In an embodiment, the polarization film may further include a third light compensation film arranged on one side of the second light compensation film and including a negative C plate.

In an embodiment, the polarization film may further include a fourth light compensation film arranged on one side of the third light compensation film and including a positive C plate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
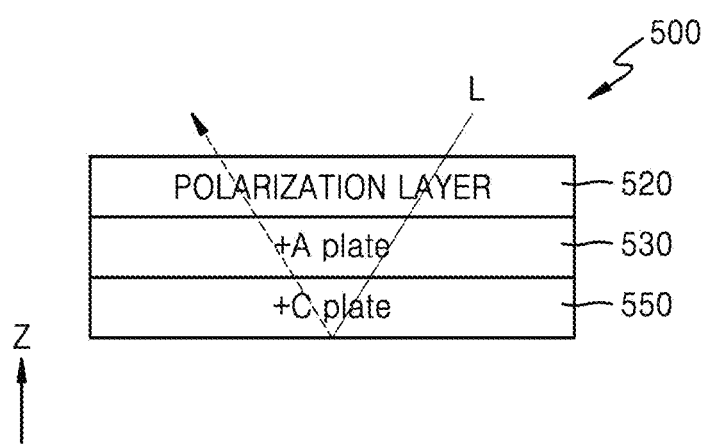
FIG. 1 is a schematic cross-sectional view of a polarization film 500 according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, the disclosure is not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have" used herein specify the presence of stated features or elements, but do not preclude the presence or addition of one or more other features or elements.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Sizes of elements in the drawings may be exaggerated for convenience of description. In other words, because the sizes and thicknesses of elements in the drawings are arbitrarily illustrated for convenience of description, the disclosure is not limited thereto.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. When a certain embodiment may be implemented differently, a particular process order may be performed differently from the described order. For example, two consecutively described processes may be performed substantially at the same time or may be performed in an order opposite to the described order.

It will be understood that when a layer, region, area, component, or element is referred to as being "connected to" another layer, region, area, component, or element, it may be "directly connected to" the other layer, region, area, component, or element or may be "indirectly connected to" the other layer, region, area, component, or element with one or more intervening layers, regions, areas, components, or elements therebetween. For example, it will be understood that when a layer, region, area, component, or element is referred to as being "electrically connected to" another layer, region, area, component, or element, it may be "directly electrically connected to" the other layer, region, area, component, or element or may be "indirectly electrically connected to" the other layer, region, area, component, or element with one or more intervening layers, regions, areas, components, or elements therebetween.

FIG. 1 is a schematic cross-sectional view of a polarization film 500 according to an embodiment.

Referring to FIG. 1, the polarization film 500 according to an embodiment may include a polarization layer 520, a first light compensation film 530, and a second light compensation film 550.

In the present embodiment, the first light compensation film 530 may be a positive A plate having a characteristic of $n_x > n_y = n_z$, and the second light compensation film 550 may be a positive C plate having a characteristic of $n_z > n_x = n_y$. Here, $n_z$ denotes a refractive index along the thickness direction (z axis) of the film, $n_x$ denotes a refractive index along a direction representing an extraordinary refractive index among the surface directions of the film, and $n_y$ denotes a refractive index along a direction perpendicular to the direction representing the extraordinary refractive index among the surface directions of the film.

In this case, the extraordinary refractive index $n_e(+A)$ of the first light compensation film 530 may be $n_x$, and the extraordinary refractive index $n_e(+C)$ of the second light compensation film 550 may be $n_z$.

As for the light transmitted through the polarization layer 520, for each wavelength, due to the difference between the extraordinary refractive index $n_e(+A)$ of the first light compensation film 530 and the extraordinary refractive index $n_e(+C)$ of the second light compensation film 550, a reflectance difference between a P wave and an S wave may occur and a polarization state thereof may vary.

In the present embodiment, it may be possible to provide the polarization film 500 in which the polarization states of the finally passed light are made as similar as possible by adjusting the polarization state for each wavelength through the difference between the extraordinary refractive index $n_e(+A)$ of the first light compensation film 530 and the extraordinary refractive index $n_e(+C)$ of the second light compensation film 550.

In the present embodiment, a value of "$n_e(+C) - n_e(+A)$" may be positive at a wavelength of 450 nm and may be negative at a wavelength of 650 nm.

Under this condition, when the power supply of a display apparatus mounted with the polarization film 500 is not driven in an off state, the polarization states for each wavelength of the light having passed through the polarization film 500 may be made as similar as possible and thus the color by the reflected light may be implemented close to neutral black.

In an embodiment, an adhesive layer may be additionally arranged between the polarization layer 520 and the first light compensation film 530 and/or between the first light compensation film 530 and the second light compensation film 550.

The first light compensation film 530 may be arranged on a surface opposite to the surface of the polarization layer 520 on which external light L is incident. When the external light L is incident on the upper surface of the polarization layer 520, the first light compensation film 530 may be arranged on the lower surface of the polarization layer 520. The second light compensation film 550 may be arranged on the lower surface of the first light compensation film 530.

The polarization layer 520 may polarize the light incident from a light source (not illustrated) into light in the same direction as a polarization axis. In some embodiments, the polarization layer 520 may include a polarizer and/or a dichroic dye in a polyvinyl alcohol ("PVA") film. The dichroic dye may include iodine molecules and/or dye molecules.

The polarization layer 520 may be formed by stretching a polyvinyl alcohol film in one direction and immersing the same in a solution of iodine and/or dichroic dye. In this case, the iodine molecules or/and the dichroic dye molecules may be arranged in parallel in the stretching direction. Because the iodine molecules and the dye molecules exhibit dichroism, they may absorb light vibrating in the stretching direction and transmit light vibrating in a direction perpendicular thereto.

The first light compensation film 530 may be arranged on one side of the polarization layer 520, for example, on the lower surface of the polarization layer 520, to transmit linearly polarized light emitted from the polarization layer 520 to provide an anti-reflection effect. When the external light L is incident on the polarization layer 520, the first light compensation film 530 may be arranged on the light exit surface of the external light L in the polarization layer 520.

The first light compensation film 530 may be a positive A plate and may be a positive uniaxial optical film having a refractive index distribution of $n_x > n_y = n_z$. Here, $n_y = n_z$ may represent a case where $n_y$ and $n_z$ are completely equal to each other and a case where $n_y$ and $n_z$ are substantially equal to each other.

The first light compensation film 530 may be a quarter-wave plate (QWP). The first light compensation film 530 may delay the phase of light polarized through the polarization layer 520 by $\lambda/4$ to circularly polarize the light. Accordingly, the reflectance of the light may be reduced.

In some embodiments, the first light compensation film 530 may exhibit reverse wavelength dispersion. That is, the first light compensation film 530 may have wavelength dependence, and a phase delay value may decrease toward a shorter wavelength. Accordingly, a phase difference value depending on wavelength may become uniform and thus a color shift may be improved.

The wavelength dispersion DSP of the first light compensation film 530 may be represented as $DSP(\lambda) = R(\lambda)/R(550 \text{ nm})$ and may satisfy the following relationship:

$DSP(450 \text{ nm}) = R(450 \text{ nm})/R(550 \text{ nm}) < 1$, $DSP(650 \text{ nm}) = R(650 \text{ nm})/R(550 \text{ nm}) > 1$, In this case, $R(\lambda)$ denotes a phase difference value at a wavelength $\lambda$.

The second light compensation film 550 may be arranged on the lower surface of the first light compensation film 530 to transmit the circularly polarized light emitted from the first light compensation film 530 to provide an anti-reflection effect. When the external light L is incident on the first light compensation film 530, the second light compensation film 550 may be arranged on the light exit surface of the external light L in the first light compensation film 530.

The second light compensation film 550 may be a positive C plate and may be a positive uniaxial optical film having a refractive index distribution of $n_z > n_x = n_y$. Here, $n_x = n_y$ may represent a case where $n_x$ and $n_y$ are completely equal to each other and a case where $n_x$ and $n_y$ are substantially equal to each other.

The first light compensation film 530 and the second light compensation film 550 may include an optically transparent resin film or a liquid crystal film.

The resin film may be formed by melting and extruding a resin and manufactured by stretching. The resin may include one or more of a cellulose ester-based resin including triacetyl cellulose or the like, a cyclic polyolefin-based resin including amorphous cyclic polyolefin (cyclic olefin polymer ("COP")), a polycarbonate-based resin, a polyester-based resin including polyethylene terephthalate ("PET"), a polyethersulfone-based resin, a polysulfone-based resin, a polyamide-based resin, a polyimide-based resin, an acyclic-polyolefin-based resin, a polyacrylate-based resin including a polymethyl methacrylate resin or the like, a polyvinyl alcohol-based resin, a polyvinyl chloride-based resin, a polyvinylidene chloride-based resin, and an acryl-based resin.

When the first light compensation film 530 and the second light compensation film 550 include the resin film, the extraordinary refractive index $n_e$ and the ordinary refractive index $n_o$ of the first light compensation film 530 and the second light compensation film 550 may be obtained by adjusting the thickness, the stretching ratio, the stretching temperature, or the like of the film before stretching the resin film.

The liquid crystal film may include a liquid crystal layer including a polymerizable liquid crystal compound of one or more of nematic liquid crystal and discotic liquid crystal.

The liquid crystal compound may be aligned in a homogeneous alignment. The homogeneous alignment may represent a state in which the liquid crystal compound is arranged in parallel to the surface direction of the film. The liquid crystal compound may be aligned in a homeotropic alignment. The homeotropic orientation may represent a state in which the liquid crystal compound is arranged in parallel to the normal direction of the film.

In addition to the liquid crystal compound, the liquid crystal film may further include a leveling agent involved in the liquid crystal coating uniformity and the surface quality, a viscosity modifier, a binder in which a radical is formed after UV exposure to induce curing, and/or the like. The refractive index of the liquid crystal film may be adjusted according to the liquid crystal compound included in the liquid crystal film, the alignment method of the liquid crystal compound, and/or the like.

When the first light compensation film 530 and the second light compensation film 550 include the liquid crystal film, the extraordinary refractive index $n_e$ and the ordinary refractive index $n_o$ of the first light compensation film 530 and the second light compensation film 550 may be obtained by adjusting the liquid crystal molecular material, the liquid crystal alignment method, the liquid crystal alignment degree, and/or the like. The liquid crystal alignment degree may be adjusted by an alignment layer during alignment of the liquid crystal.

Figure 2:
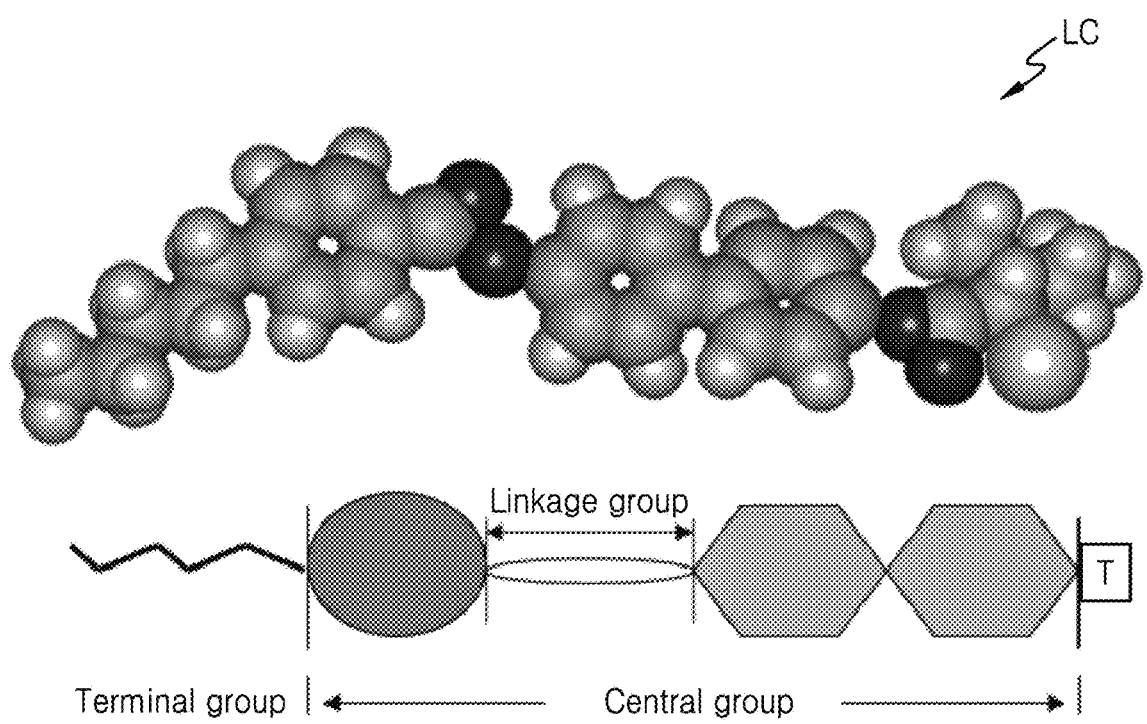
FIG. 2 is a diagram illustrating an example of a liquid crystal molecule that may be included in a first light compensation film and/or a second light compensation film.

FIG. 2 is a diagram illustrating an example of a liquid crystal molecule that may be included in a first light compensation film and/or a second light compensation film.

Referring to FIG. 2, the liquid crystal molecule LC included in the first light compensation film 530 and/or the second light compensation film 550 of the disclosure may have a rod shape. The liquid crystal molecule LC may include a terminal group, a linkage group, a central group, and a polar group (T-group).

The terminal group and the linkage group may exhibit the length and/or viscosity characteristics of the liquid crystal molecule LC. The terminal group may include at least one of an alkyl group, an alkoxyl group, an alkenyl group, and an alkenyloxy group. The linkage group may include at least one of tolane, ester (COO), ethylene ($CH_2CH_2$), $OCH_2$, and $(CH_2)n$.

The central group may exhibit the absolute refractive index and refractive index anisotropy characteristics of the liquid crystal molecule LC. The central group may include at least one of the aromatic rings represented by Formula 1 below. The short-wavelength refractive index of the liquid crystal molecule LC may be adjusted according to the content of the central group.

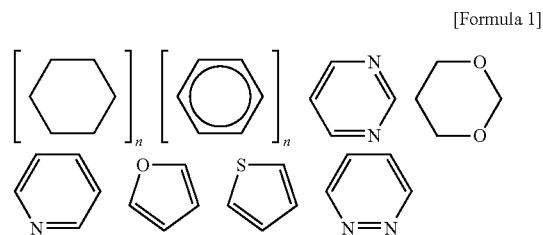

[Formula 1]

The polar group (T-group) may include an alkyl group, an alkoxyl group, CN, a halogen atom, and/or the like. The polarity affecting the liquid crystal phase may vary depending on the polarity group.

Moreover, the wavelength dispersion of the liquid crystal molecule LC may be adjusted according to the ratio between the central group and the terminal group. Also, the extraordinary refractive index $n_e$ of the liquid crystal molecule LC and the ordinary refractive index no of the liquid crystal molecule LC may be adjusted by selecting the terminal group, the linkage group, the central group, and the polar group (T-group) included in the liquid crystal molecule LC. In the present embodiment, the extraordinary refractive index $n_e$ of the first light compensation film 530 and/or the second light compensation film 550 may be about 1.57 to about 1.59, and the ordinary refractive index no thereof may be about 1.47 to about 1.49.

The first light compensation film 530 and/or the second light compensation film 550 may include the liquid crystal molecule LC, a photocurable monomer, a polymerization initiator, and/or the like. The first light compensation film 530 and/or the second light compensation film 550 may be formed by coating a base film with a composition including a liquid crystal molecule, a photocurable monomer, a polymerization initiator, and a solvent and then by tilting the liquid crystal molecule LC in a certain direction through an ultraviolet ("UV") irradiation and/or rubbing process.

As described above, the difference value $n_e(+C)-n_e(+A)$ between the extraordinary refractive index $n_e(+A)$ of the first light compensation film 530 and the extraordinary refractive index $n_e(+C)$ of the second light compensation film 550 may be positive at a wavelength of 450 nm and may be negative at a wavelength of 650 nm.

In this condition, it may be seen that the polarization states of the light having passed through the polarization film 500 are made similar.

Figure 3:
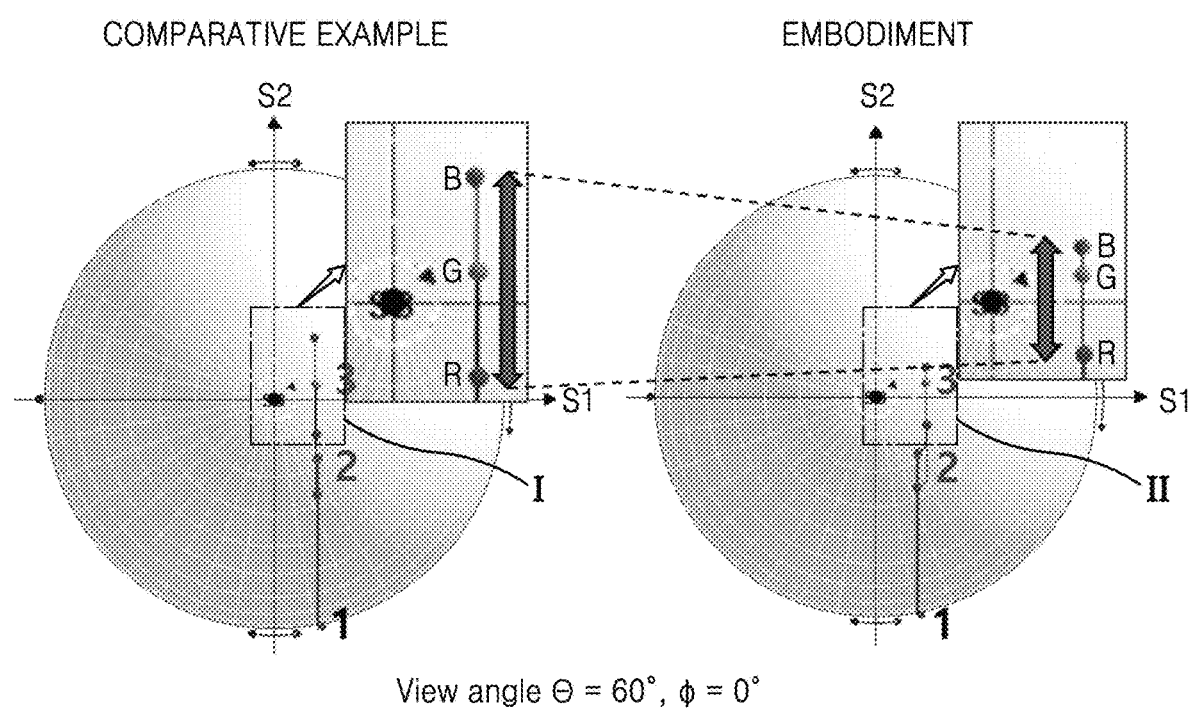
FIG. 3 is a diagram illustrating the polarization state of a Comparative Example and an Embodiment on the Poincare sphere.
Figure 4A:
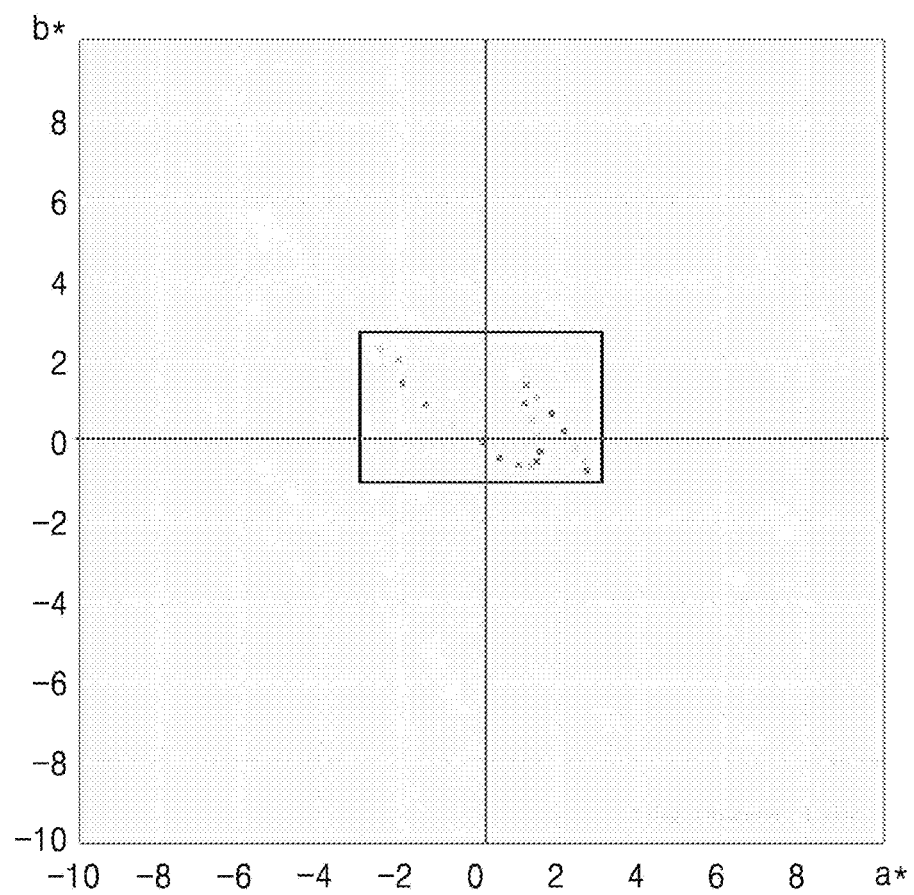
FIG. 4A is a graph illustrating the reflection chroma of a polarization film of Comparative Example 1 in the CIE L*a*b* coordinates.
Figure 4B:
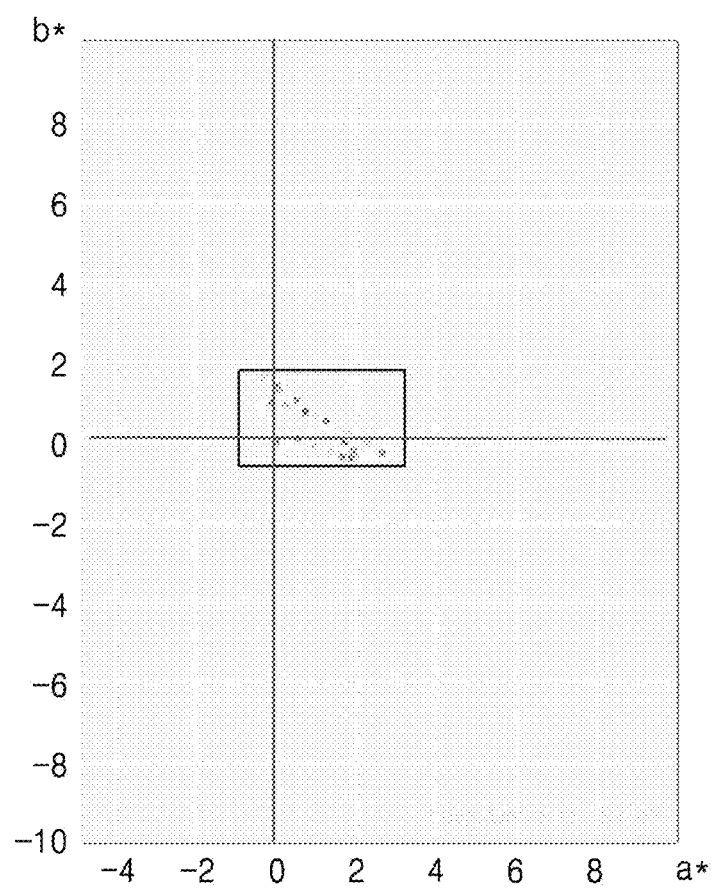
FIG. 4B is a graph illustrating the reflection chroma of a polarization film of Embodiment 1 in the CIE L*a*b* coordinates.
Figure 4C:
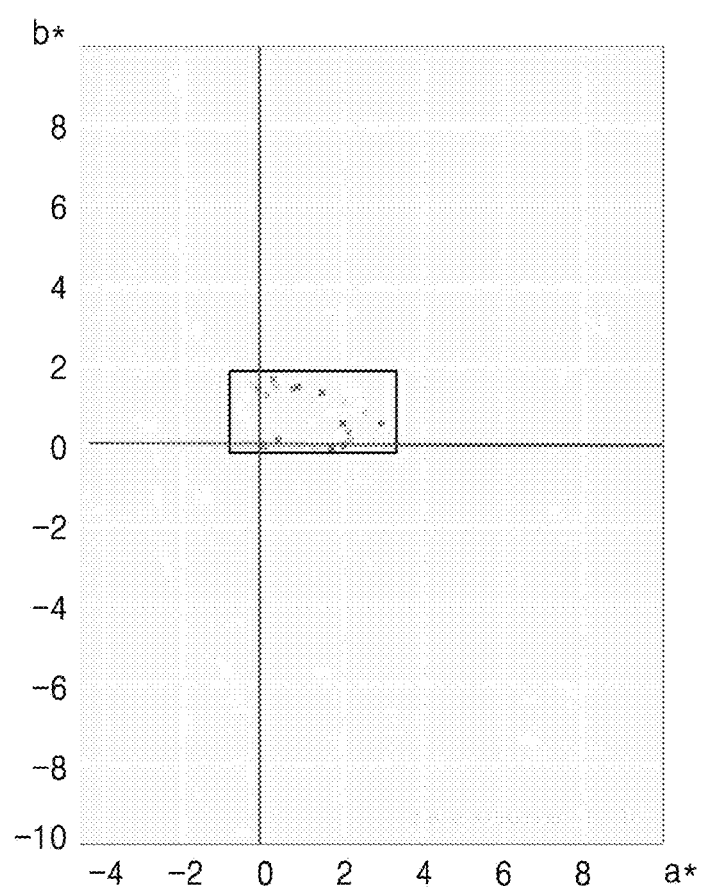
FIG. 4C is a graph illustrating the reflection chroma of a polarization film of Embodiment 2 in the CIE L*a*b* coordinates.
Figure 4D:
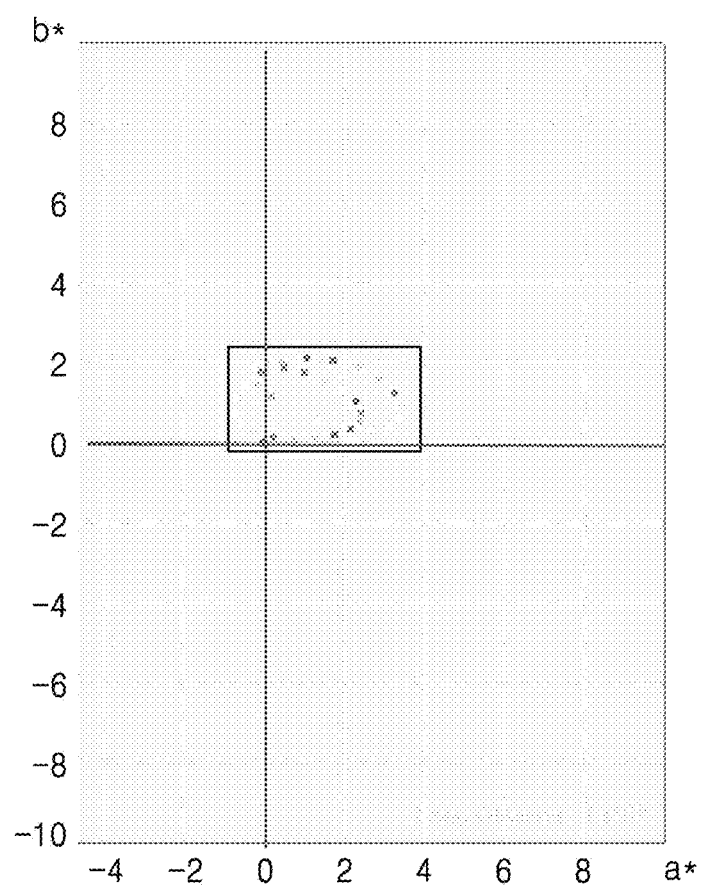
FIG. 4D is a graph illustrating the reflection chroma of a polarization film of Embodiment 3 in the CIE L*a*b* coordinates.

FIG. 3 is a diagram illustrating the polarization states of Comparative Example and Embodiment on the Poincare sphere. FIG. 3 illustrates the S1-S2 plane of the Poincare sphere, and the polarization state may represent a value at polar angle θ=60°, azimuth angle φ=0° that is the side viewing angle of the polarization film.

In the Poincare sphere, the polarization state is matched to a sphere with a radius of 1, the origin of the Poincare sphere represents non-polarization that is a state that is not polarized at all, and other points therein represent partial polarization. The degree of polarization increases gradually toward the outside, and when the distance becomes 1, it represents a completely polarized state.

In FIG. 3, Comparative Example corresponds to a case where the extraordinary refractive index of the first light compensation film 530 and the extraordinary refractive index of the second light compensation film 550 are equal to each other, and Embodiment corresponds to a case where the value of "$n_e(+C)-n_e(+A)$" is positive at a wavelength of 450 nm and is negative at a wavelength of 650 nm.

In the enlarged view of region I of the Poincare sphere of Comparative Example, it may be seen that the polarization state of blue light B (a wavelength of 450 nm), the polarization state of green light G (a wavelength of 550 nm), and the polarization state of red light R (a wavelength of 650 nm) are spread and distributed along the S2 axis. This is represented by an arrow in region I in FIG. 3. As such, when the difference in the polarization state for each wavelength is great, the reflectance of each of blue light, green light, and red light may vary and thus the polarization film may be colored.

In the enlarged view of region II of the Poincare sphere of Embodiment, it may be seen that the polarization state of blue light B (a wavelength of 450 nm), the polarization state of green light G (a wavelength of 550 nm), and the polarization state of red light R (a wavelength of 650 nm) are less spread and distributed along the S2 axis than the polarization states of Comparative Example. This is represented by an arrow in region II in FIG. 3. Accordingly, it may be seen that the difference in the polarization state for each wavelength of incident light may be reduced.

In some embodiments, the value of $n_e(+C)-n_e(+A)$ may be about 0.02 to about at a wavelength of 450 nm corresponding to blue light and about –0.08 to about –0.02 at a wavelength of 650 nm corresponding to red light. In this condition, it may be seen that the side reflection chroma characteristics of the polarization film 500 are excellent.

Table 1 below illustrates values of $n_e(+C)-n_e(+A)$ according to wavelengths of embodiments and azimuthal angle color distribution (AACD) values that are side reflection chroma characteristics according to embodiments.

TABLE 1

|  | $n_e(+C) - n_e(+A)$ | | | AACD ($\theta = 60°$, |
|---|---|---|---|---|
|  | B(450 nm) | G(550 nm) | R(650 nm) | $\varphi = 0\sim360°$) |
| Comparative Example 1 | 0 | 0 | 0 | 16.72 |
| Embodiment 1 | 0.02 | 0 | –0.02 | 7.00 |
| Embodiment 2 | 0.05 | 0 | –0.05 | 6.65 |
| Embodiment 3 | 0.08 | 0 | –0.08 | 7.70 |
| Comparative Example 2 | 1 | 0 | –1 | 18.09 |

Comparative Example 1 represents a case where there is no difference between the extraordinary refractive index $n_e(+A)$ of the first light compensation film 530 and the extraordinary refractive index $n_e(+C)$ of the second light compensation film 550. Embodiment 1 represents a case where the value of $n_e(+C)-n_e(+A)$ is 0.02 at a wavelength of 450 nm and –0.02 at a wavelength of 650 nm. Embodiment 2 represents a case where the value of $n_e(+C)-n_e(+A)$ is 0.05 at a wavelength of 450 nm and –0.05 at a wavelength of 650 nm. Embodiment 3 represents a case where the value of $n_e(+C)-n_e(+A)$ is 0.08 at a wavelength of 450 nm and –0.08 at a wavelength of 650 nm. Comparative Example 2 represents a case where the value of $n_e(+C)-n_e(+A)$ is 1 at a wavelength of 450 nm and –1 at a wavelength of 650 nm.

The side characteristics AACD may be obtained by the following equation: AACD(Azimuthal Angle Color Distribution)={Max(a*)–Min(a*)}×{Max(b*)–M(b*)} Here, a* and b* are coordinate values in the CIE L*a*b* coordinate system, Max(a*) and Min(a*) are a maximum value and a minimum value, respectively, among the a* coordinate values measured for an azimuth angle $\varphi=0°$ to 360°, and Max(b*) and Min(b*) are a maximum value and a minimum value of the b* coordinate values, respectively, measured for an azimuth angle $\varphi=0°$ to 360°.

These side characteristics may be extracted from the values represented in the CIE L*a*b* coordinate system according to the azimuth angle, and it may mean that the side color change decreases according to the azimuth angle as the value thereof decreases.

FIGS. 4A to 4D are graphs illustrating the reflection chromas of polarization films of Comparative Example 1, Embodiment 1, Embodiment 2, and Embodiment 3 in the CIE L*a*b* coordinates, respectively. The reflection chromas were measured for a polar angle $\theta=60°$, an azimuth angle $\varphi=0°$ to 360°.

Referring to FIGS. 4A to 4D, it may be seen that reflection chromas of Comparative Example 1 are widely distributed in quadrants of CIE L*a*b* coordinates, whereas reflection chromas of Embodiment 1 to Embodiment 3 are narrowly distributed to be adjacent to the coordinates of a*=0, b*=0.

As a result of measuring the AACD based on this, as illustrated in Table 1 above, it may be seen that the AACD value of Comparative Example 1 is greatest as 16.72 and the AACD values of Embodiment 1 to Embodiment 3 are about 6.7 to about 7.0 that is 10 or less. A small AACD value may mean that the side color change is small according to the azimuth angle.

Moreover, Comparative Example 2 corresponds to a case where the value of $n_e(+C)-n_e(+A)$ is 1 at a wavelength of 450 nm and –1 at a wavelength of 650 nm, that is, a case where the difference between the extraordinary refractive index of the first light compensation film 530 and the extraordinary refractive index of the second light compensation film 550 is greater than that of the Embodiments, and in this case, it may be seen that the AACD value is 18.09 that is even greater than AACD value of Comparative Example 1.

In the present embodiment, the value of $n_e(+C)-n_e(+A)$ may be positive at a wavelength of 450 nm and may be negative at a wavelength of 650 nm. In some embodiments, the value of $n_e(+C)-n_e(+A)$ may be about 0.02 to about 0.08 at a wavelength of 450 nm and about –0.08 to about –0.02 at a wavelength of 650 nm.

Under this condition, when the power supply of a display apparatus mounted with the polarization film 500 is not driven in an off state, the polarization states for each wavelength of the light having passed through the polarization film 500 may be made as similar as possible and thus the color by the reflected light may be implemented close to neutral black. Also, a change in the reflection chroma according to the azimuth angle may be small.

Figure 5:
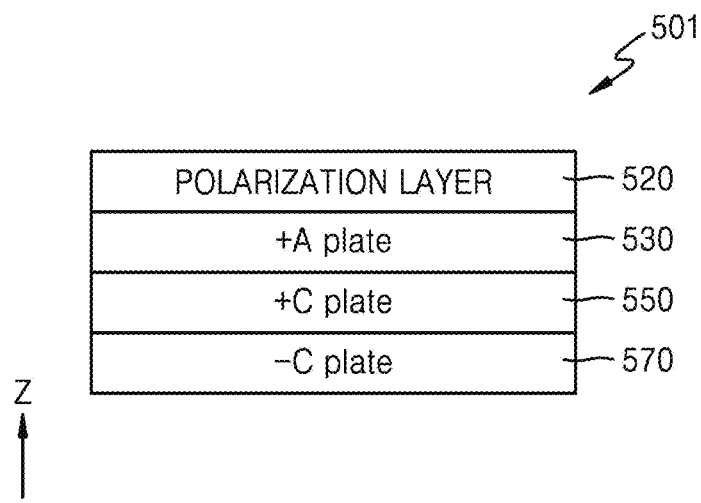
FIG. 5 is a schematic cross-sectional view of a polarization film according to another embodiment.
Figure 6:
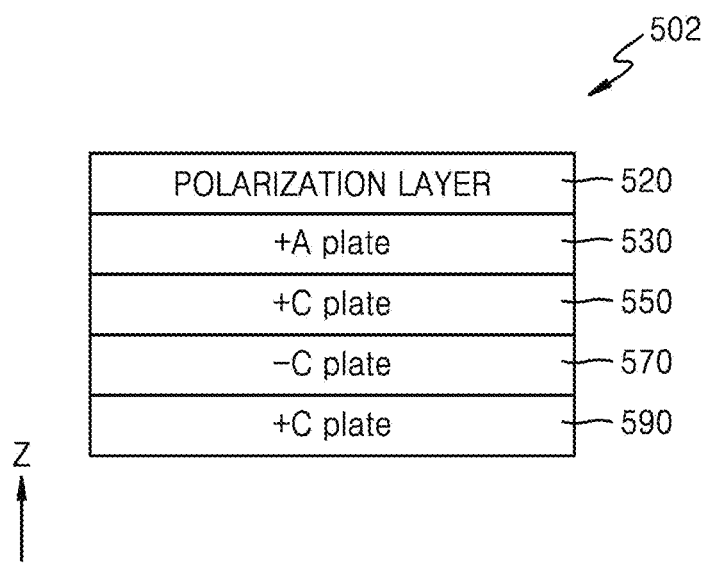
FIG. 6 is a schematic cross-sectional view of a polarization film according to still another embodiment.

FIGS. 5 and 6 are schematic cross-sectional views of polarization films according to other embodiments. In FIGS. 5 and 6, like reference numerals as those in FIG. 1 denote like members, and thus redundant descriptions thereof will be omitted for conciseness.

Referring to FIG. 5, a polarization film 501 according to an embodiment may include a polarization layer 520, a first light compensation film 530 that is a positive A plate, and a second light compensation film 550 that is a positive C plate.

In this case, the value of $n_e(+C)-n_e(+A)$ may be positive at a wavelength of 450 nm and negative at a wavelength of 550 nm. Here, ne(+A) denotes the extraordinary refractive index of the first light compensation film 530 and $n_e(+C)$ denotes the extraordinary refractive index of the second light compensation film 550.

In the present embodiment, the polarization film 501 may further include a third light compensation film 570 arranged on the lower surface of the second light compensation film 550. The third light compensation film 570 may be a negative C plate in which $n_z<n_x=n_y$. The third light compensation film 570 may be introduced to adjust the phase difference in the thickness direction Z of the polarization film 501. By using the third light compensation film 570, the phase difference in the thickness direction of the polarization film 501 may be adjusted close to zero.

The polarization film 501 may adjust the refractive index differently for each wavelength by the first light compensation film 530 and the second light compensation film 550 and may adjust the phase difference depending on the thickness by the third light compensation film 570, and thus the reflection color may be easily adjusted close to neutral black.

Referring to FIG. 6, a polarization film 502 according to an embodiment may include a polarization layer 520, a first light compensation film 530 that is a positive A plate, and a second light compensation film 550 that is a positive C plate.

In this case, the value of $n_e(+C)-n_e(+A)$ may be positive at a wavelength of 450 nm and negative at a wavelength of 550 nm. Here, ne(+A) denotes the extraordinary refractive index of the first light compensation film 530 and $n_e(+C)$ denotes the extraordinary refractive index of the second light compensation film 550.

In the present embodiment, the polarization film 502 may further include a third light compensation film 570 and a fourth light compensation film 590 arranged on the lower surface of the second light compensation film 550. In an embodiment, the third light compensation film 570 may be arranged on the lower surface of the second light compensation film 550, and the fourth light compensation film 590 may be arranged on the lower surface of the third light compensation film 570. The third light compensation film 570 may be a negative C plate in which $n_z<n_x=n_y$. The fourth light compensation film 590 may be a positive C plate in which $n_z>n_x=n_y$. The third light compensation film 570 and the fourth light compensation film 590 may be introduced to adjust the phase difference in the thickness direction of the polarization film 502. By using the third light compensation film 570 and the fourth light compensation film 590, the phase difference in the thickness direction of the polarization film 502 may be adjusted close to zero.

The polarization film 502 may adjust the refractive index differently for each wavelength by the first light compensation film 530 and the second light compensation film 550 and may adjust the phase difference depending on the thickness by the third light compensation film 570 and the fourth light compensation film 590, and thus the reflection color may be easily adjusted close to neutral black.

In the embodiments of FIGS. 5 and 6, the value of $n_e(+C)-n_e(+A)$ may be positive at a wavelength of 450 nm and may be negative at a wavelength of 650 nm. In some embodiments, the value of $n_e(+C)-n_e(+A)$ may be about 0.02 to about 0.08 at a wavelength of 450 nm and about −0.08 to about −0.02 at a wavelength of 650 nm.

Under this condition, when the power supply of a display apparatus mounted with the polarization film 501 or 502 is not driven in an off state, the polarization states for each wavelength of the light having passed through the polarization film 501 or 502 may be made as similar as possible and thus the color by the reflected light may be implemented close to neutral black. Also, a change in the reflection chroma according to the azimuth angle may be small.

Figure 7:
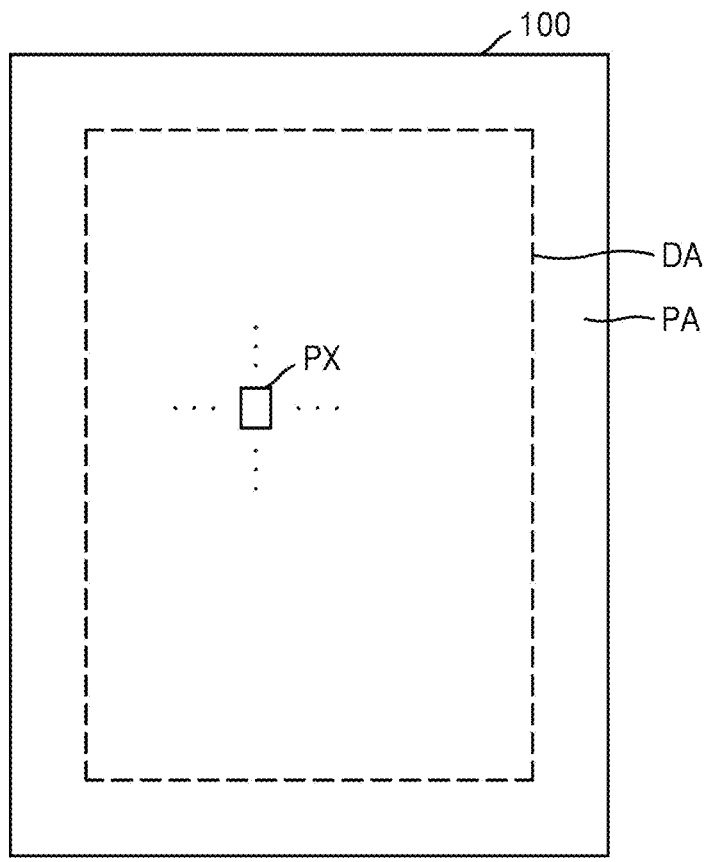
FIG. 7 is a plan view schematically illustrating a display apparatus according to an embodiment.

FIG. 7 is a plan view schematically illustrating a display apparatus according to an embodiment.

A plurality of pixels PX each including a display element such as an organic light emitting diode may be arranged in a display area DA of a substrate 100. The pixel PX may further include a plurality of thin film transistors and a storage capacitor for controlling the display element. The number of thin film transistors included in one pixel may be variously modified, such as 1 to 7.

Various lines for transmitting electrical signals to be applied to the display area DA may be located in a peripheral area PA of the substrate 100. A thin film transistor may also be arranged in the peripheral area PA, and in this case, the thin film transistor arranged in the peripheral area PA may be a portion of a circuit unit for controlling an electrical signal applied to the display area DA.

Hereinafter, an organic light emitting display apparatus will be described as an example of a display apparatus according to an embodiment; however, the display apparatus of the disclosure is not limited thereto. In other embodiments, various types of display apparatuses such as inorganic EL displays (inorganic light emitting displays) and quantum dot light emitting displays may be used.

Figure 8:
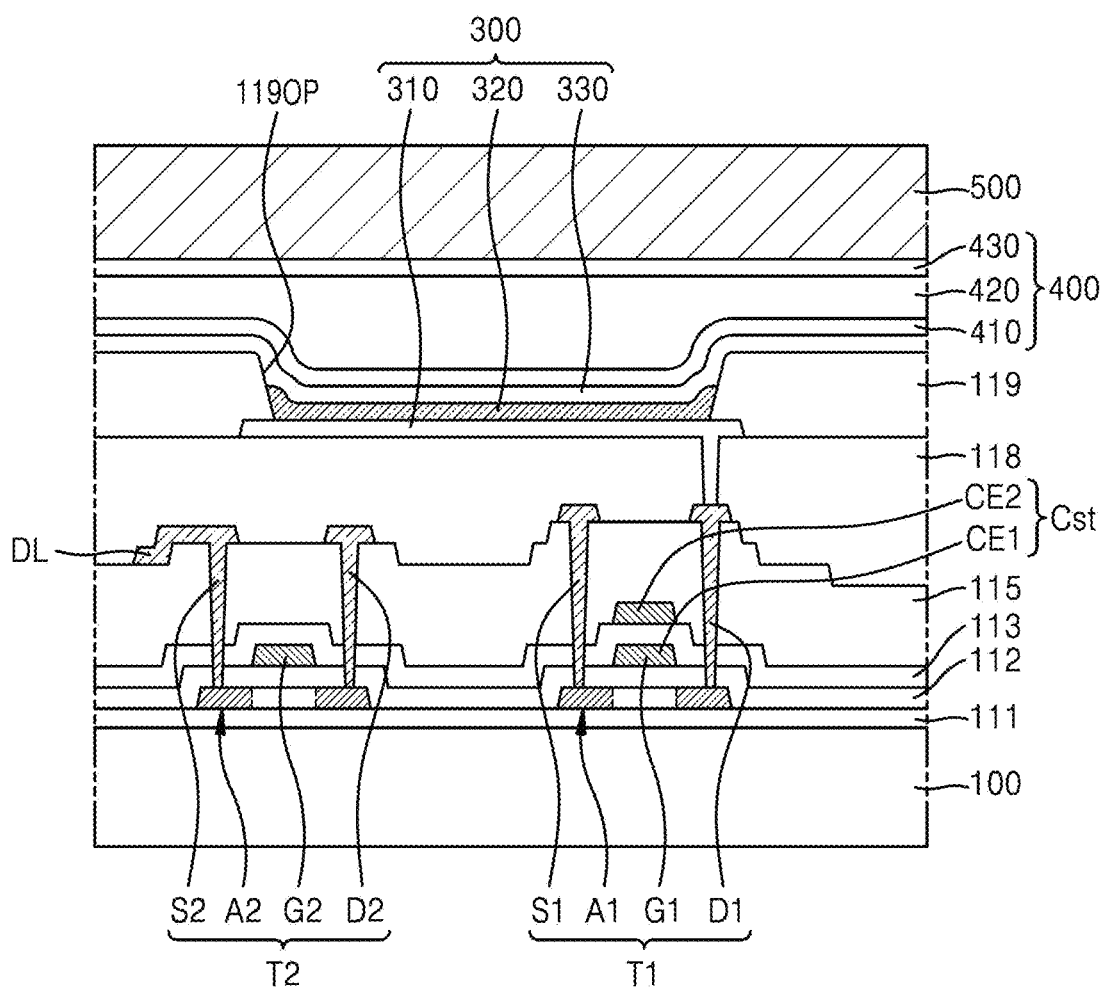
FIG. 8 is a cross-sectional view schematically illustrating a portion of a display apparatus according to an embodiment.

FIG. 8 is a cross-sectional view schematically illustrating a portion of a display apparatus according to an embodiment.

Referring to FIG. 8, the display apparatus may include a substrate 100, thin film transistors T1 and T2 disposed over the substrate 100, and an organic light emitting diode 300 electrically connected to the thin film transistors T1 and T2. Also, the organic light emitting display apparatus may further include various insulating layers 111, 112, 113, 115, 118, and 119 and a storage capacitor Cst.

The substrate 100 may be formed of various materials such as glass materials, metal materials, or plastic materials. According to an embodiment, the substrate 100 may be a flexible substrate and include, for example, a polymer resin such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP").

A buffer layer 111 may be located on the substrate 100 to reduce or block the penetration of foreign materials, moisture, or external air from under the substrate 100 and may provide a flat surface on the substrate 100. The buffer layer 111 may include an inorganic material such as oxide or nitride, an organic material, or an organic/inorganic composite and may include a single-layer or multiple-layer structure of an inorganic material and an organic material. A barrier layer (not illustrated) for blocking the penetration of external air may be further included between the substrate 100 and the buffer layer 111. In some embodiments, the buffer layer 111 may include silicon oxide ($SiO_2$) or silicon nitride ($SiN_x$).

A first thin film transistor T1 and/or a second thin film transistor T2 may be disposed over the buffer layer 111. The first thin film transistor T1 may include a semiconductor layer A1, a gate electrode G1, a source electrode S1, and a drain electrode D1, and the second thin film transistor T2 may include a semiconductor layer A2, a gate electrode G2, a source electrode S2, and a drain electrode D2. The first thin film transistor T1 may function as a driving thin film transistor connected to the organic light emitting diode 300 to drive the organic light emitting diode 300. The second thin film transistor T2 may be connected to a data line DL to function as a switching thin film transistor. Although two thin film transistors are illustrated, the disclosure is not limited thereto. The number of thin film transistors may be variously modified, such as 1 to 7.

The semiconductor layers A1 and A2 may include amorphous silicon or may include polysilicon. In other embodiments, the semiconductor layers A1 and A2 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layers A1 and A2 may include a channel area and a source area and a drain area that are doped with dopants.

The gate electrodes G1 and G2 may be disposed over the semiconductor layers A1 and A2 with a first gate insulating layer 112 therebetween. The gate electrodes G1 and G2 may include molybdenum (Mo), aluminum (Al), copper (Cu), titanium (Ti), or the like and may include a single layer or multiple layers. For example, the gate electrodes G1 and G2 may include a single Mo layer.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may be provided to cover the gate electrodes G1 and G2. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first storage electrode CE1 of the storage capacitor Cst may overlap the first thin film transistor T1. For example, the gate electrode G1 of the first thin film transistor T1 may function as the first storage electrode CE1 of the storage capacitor Cst. However, the disclosure is not limited thereto. The storage capacitor Cst may not overlap the first thin film transistor T1 and may be formed apart from the thin film transistors T1 and T2.

A second storage electrode CE2 of the storage capacitor Cst may overlap the first storage electrode CE1 with the second gate insulating layer 113 therebetween. In this case, the second gate insulating layer 113 may function as a dielectric layer of the storage capacitor Cst. The second storage electrode CE2 may include a conductive material including molybdenum (Mo), aluminum (Al), copper (Cu), titanium (Ti), or the like and may include a single layer or multiple layers including the above material. For example, the second storage electrode CE2 may include a single layer of Mo or multiple layers of Mo/Al/Mo.

An interlayer insulating layer 115 may be formed on the entire surface of the substrate 100 to cover the second storage electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The source electrodes S1 and S2 and the drain electrodes D1 and D2 may be disposed over the interlayer insulating layer 115. The source electrodes S1 and S2 and the drain electrodes D1 and D2 may include a conductive material including molybdenum (Mo), aluminum (Al), copper (Cu), titanium (Ti), or the like and may include a single layer or multiple layers including the above material. For example, the source electrodes S1 and S2 and the drain electrodes D1 and D2 may include a multilayer structure of Ti/Al/Ti.

A planarization layer 118 may be located over the source electrodes S1 and S2 and the drain electrodes D1 and D2, and the organic light emitting diode 300 may be located over the planarization layer 118. The organic light emitting diode 300 may include a first electrode 310, an intermediate layer 320 including an organic emission layer, and a second electrode 330.

The planarization layer 118 may have a flat upper surface such that the first electrode 310 may be formed flat. The planarization layer 118 may include a single layer or multiple layers formed of an organic material or an inorganic material. The planarization layer 118 may include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or any blend thereof. The planarization layer 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the forming of the planarization layer 118, chemical mechanical polishing may be performed to provide a flat upper surface.

The planarization layer 118 may include an opening portion exposing any one of the source electrode S1 and the drain electrode D1 of the first thin film transistor T1, and the first electrode 310 may be electrically connected to the first thin film transistor T1 by contacting the source electrode S1 or the drain electrode D1 through the opening portion.

A pixel definition layer 119 may be disposed over the first electrode 310. The pixel definition layer 119 may define a pixel by including an opening 119OP corresponding to each subpixel, that is, an opening 119OP through which at least a central portion of the first electrode 310 is exposed. Also, the pixel definition layer 119 may increase the distance between the edge of the first electrode 310 and the second electrode 330, thereby preventing an arc or the like from occurring therebetween. The pixel definition layer 119 may be formed of, for example, an organic material such as polyimide or hexamethyldisiloxane (HMDSO).

A spacer (not illustrated) may be disposed over the pixel definition layer 119. The spacer may be used to prevent mask marking that may occur during a mask process necessary for forming the intermediate layer 320 of the organic light emitting diode 300. The spacer may include an organic material such as polyimide or hexamethyldisiloxane (HMDSO). The spacer may be simultaneously formed of the same material as the pixel definition layer 119. In this case, a halftone mask may be used.

The intermediate layer 320 of the organic light emitting diode 300 may include an organic emission layer ("EML"). The organic emission layer may include an organic material including a fluorescent or phosphorescent material emitting red, green, blue, or white light. The organic emission layer may include a low molecular weight organic material or a high molecular weight organic material, and functional layers such as a hole transport layer ("HTL"), a hole injection layer ("HIL"), an electron transport layer ("ETL"), and an electron injection layer ("EIL") may optionally be further disposed under and over the organic emission layer. The intermediate layer 320 may be arranged corresponding to each of a plurality of first electrodes 310. However, the disclosure is not limited thereto. The intermediate layer 320 may be variously modified such as including an integral layer over a plurality of first electrodes 310.

The second electrode 330 may include a transparent electrode or a reflective electrode. In some embodiments, the second electrode 330 may include a transparent or semi-transparent electrode and may include a thin metal layer having a low work function and including Li, Ca, LiF/Ca, LiF/Al, Al, Ag, Mg, or any compound thereof. Also, a transparent conductive oxide ("TCO") layer such as ITO, IZO, ZnO, or $In_2O_3$ may be further disposed over the thin metal layer. The second electrode 330 may be disposed over the display area DA and the peripheral area PA and may be disposed over the intermediate layer 320 and the pixel definition layer 119. The second electrode 330 may be integrally formed in a plurality of organic light emitting diodes 300 to correspond to a plurality of first electrodes 310. A more detailed configuration of the organic light emitting diode 300 according to an embodiment will be described below.

A thin film encapsulation layer 400 encapsulating the display area DA may be further included over the organic light emitting diode 300. The thin film encapsulation layer 400 may cover the display area DA to protect the organic light emitting diode 300 from external moisture or oxygen. The thin film encapsulation layer 400 may include a first inorganic encapsulation layer 410, an organic encapsulation layer 420, and a second inorganic encapsulation layer 30.

The first inorganic encapsulation layer 410 may cover the second electrode 330 and may include ceramic, metal oxide, metal nitride, metal carbide, metal oxynitride, indium oxide ($In_2O_3$), tin oxide ($SnO_2$), indium tin oxide ("ITO"), silicon oxide, silicon nitride, and/or silicon oxynitride. However, when necessary, other layers such as a capping layer may be arranged between the first inorganic encapsulation layer 410 and the second electrode 330. Because the first inorganic encapsulation layer 410 is formed along a structure thereunder, the upper surface thereof may not be flat as illustrated in FIG. 8.

The organic encapsulation layer 420 may cover the first inorganic encapsulation layer 410 and may have a substantially flat upper surface unlike the first inorganic encapsulation layer 410. Particularly, the upper surface of the organic encapsulation layer 420 may be substantially flat at a portion corresponding to the display area DA. The organic encapsulation layer 420 may include at least one of acryl, metacrylic, polyester, polyethylene, polypropylene, polyethylene terephthalate (PET), polyethylene naphthalate, polycarbonate, polyimide, polyethylene sulfonate, polyoxymethylene, polyarylate, and hexamethyldisiloxane.

The second inorganic encapsulation layer 430 may cover the organic encapsulation layer 420 and may include ceramic, metal oxide, metal nitride, metal carbide, metal oxynitride, indium oxide ($In_2O_3$), tin oxide ($SnO_2$), indium tin oxide (ITO), silicon oxide, silicon nitride, and/or silicon oxynitride. The second inorganic encapsulation layer 430 may contact the first inorganic encapsulation layer 410 at the edge thereof located outside the display area DA such that the organic encapsulation layer 420 may not be exposed to the outside.

As such, because the thin film encapsulation layer 400 includes the first inorganic encapsulation layer 410, the organic encapsulation layer 420, and the second inorganic encapsulation layer 430, even when a crack occurs in the thin film encapsulation layer 400 through the multilayer structure, the crack may not be connected between the first inorganic encapsulation layer 410 and the organic encapsulation layer 420 or between the organic encapsulation layer 420 and the second inorganic encapsulation layer 430. Accordingly, the formation of a path through which external moisture or oxygen or the like penetrates into the display area DA may be prevented or minimized.

Moreover, in the present embodiment, the thin film encapsulation layer 400 is used as an encapsulation member for encapsulating the organic light emitting diode 300; however, the disclosure is not limited thereto. For example, an encapsulation substrate bonded to the substrate 100 by sealant or frit may be used as a member for encapsulating the organic light emitting diode 300.

In the present embodiment, a polarization film 500 for improving outdoor visibility may be disposed over the thin film encapsulation layer 400 or over the encapsulation substrate. As illustrated in FIG. 1, the polarization film 500 may include a polarization layer 520, a first light compensation film 530, and a second light compensation film 550. In this case, the second light compensation film 550 of the polarization film 500 may be arranged closer to the thin film encapsulation layer 400 than the polarization layer 520.

Various functional layers such as a touch screen layer and a window may be further included over the thin film encapsulation layer 400, and a capping layer for improving light efficiency may be further included between the second electrode 330 and the thin film encapsulation layer 400.

According to embodiments, a polarization film having excellent characteristics may be provided because the difference value between the extraordinary refractive indexes of a first light compensation film and a second light compensation film included in the polarization film is different for each wavelength.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A polarization film comprising:
   a polarization layer;
   a first light compensation film arranged on one side of the polarization layer and comprising a positive A plate; and
   a second light compensation film arranged on one side of the first light compensation film and comprising a positive C plate,
   wherein a value of $n_e(+C)-n_e(+A)$ is positive at a wavelength of 450 nanometers (nm) and negative at a wavelength of 650 nm,
   where $n_e(+A)$ denotes an extraordinary refractive index of the first light compensation film and $n_e(+C)$ denotes an extraordinary refractive index of the second light compensation film.

2. The polarization film of claim 1, wherein the value of $n_e(+C)-n_e(+A)$ is about 0.02 to about 0.08 at a wavelength of 450 nm and about −0.08 to about −0.02 at a wavelength of 650 nm.

3. The polarization film of claim 1, wherein an azimuthal angle color distribution (AACD) value at a polar angle of 60° of the polarization film is 10 or less,
   wherein AACD={Max(e)−Min(a*)}×{Max(b*)−M(b*)},
   where a* and b* are coordinate values in a CIE L*a*b* coordinate system, Max(a*) and Min(a*) are a maximum value and a minimum value among a* coordinate values measured for an azimuth angle φ=0° to 360°, respectively, and Max(b*) and Min(b*) are a maximum value and a minimum value of b* coordinate values measured for an azimuth angle φ=0° to 360°, respectively.

4. The polarization film of claim 1, wherein the second light compensation film comprises liquid crystal molecules.

5. The polarization film of claim 4, wherein the liquid crystal molecules are rod-shaped.

6. The polarization film of claim 1, wherein the first light compensation film comprises a quarter-wave plate (QWP).

7. The polarization film of claim 6, wherein the first light compensation film has reverse wavelength dispersion.

8. The polarization film of claim 7, wherein the wavelength dispersion (DSP) of the first light compensation film satisfies the following conditions:

DSP(450 nm)=R(450 nm)/R(550 nm)<1,

DSP(650 nm)=R(650 nm)/R(550 nm)>1, where R(λ) denotes a phase difference value at a wavelength λ.

9. The polarization film of claim 1, further comprising a third light compensation film arranged on one side of the second light compensation film and comprising a negative C plate.

10. The polarization film of claim 9, further comprising a fourth light compensation film arranged on one side of the third light compensation film and comprising a positive C plate.

11. A display apparatus comprising:
a substrate;
a plurality of display elements disposed over the substrate;
an encapsulation member encapsulating the plurality of display elements; and
a polarization film disposed over the encapsulation member,
wherein the polarization film comprises:
a polarization layer;
a first light compensation film arranged on one side of the polarization layer and comprising a positive A plate; and
a second light compensation film arranged on one side of the first light compensation film and comprising a positive C plate,
wherein a value of $n_e(+C)-n_e(+A)$ is positive at a wavelength of 450 nm and negative at a wavelength of 650 nm,
where $n_e(+A)$ denotes an extraordinary refractive index of the first light compensation film and $n_e(+C)$ denotes an extraordinary refractive index of the second light compensation film.

12. The display apparatus of claim 11, wherein the value of $n_e(+C)-n_e(+A)$ is about 0.02 to about 0.08 at a wavelength of 450 nm and about −0.08 to about −0.02 at a wavelength of 650 nm.

13. The display apparatus of claim 11, wherein an azimuthal angle color distribution (AACD) value at a polar angle of 60° of the polarization film is 10 or less,
wherein AACD={Max(a*)−Min(a*)}×{Max(b*)−M(b*)},
where a* and b* are coordinate values in a CIE L*a*b* coordinate system, Max(a*) and Min(a*) are a maximum value and a minimum value among a* coordinate values measured for an azimuth angle φ=0° to 360°, respectively, and Max(b*) and Min(b*) are a maximum value and a minimum value of b* coordinate values measured for an azimuth angle φ=0° to 360°, respectively.

14. The display apparatus of claim 11, wherein the encapsulation member comprises a thin film encapsulation layer, and the thin film encapsulation layer comprises a first inorganic encapsulation layer, an organic encapsulation layer, and a second inorganic encapsulation layer that are sequentially stacked.

15. The display apparatus of claim 11, wherein the second light compensation film is arranged closer to the encapsulation member than the polarization layer.

16. The display apparatus of claim 11, wherein the second light compensation film comprises rod-shaped liquid crystal molecules.

17. The display apparatus of claim 11, wherein the first light compensation film comprises a quarter-wave plate (QWP).

18. The display apparatus of claim 17, wherein wavelength dispersion (DSP) of the first light compensation film satisfies the following conditions:

DSP(450 nm)=R(450 nm)/R(550 nm)<1,

DSP(650 nm)=R(650 nm)/R(550 nm)>1, where R(λ) denotes a phase difference value at a wavelength λ.

19. The display apparatus of claim 11, wherein the polarization film further comprises a third light compensation film arranged on one side of the second light compensation film and comprising a negative C plate.

20. The display apparatus of claim 19, wherein the polarization film further comprises a fourth light compensation film arranged on one side of the third light compensation film and comprising a positive C plate.

* * * * *